United States Patent
Heil et al.

(10) Patent No.: US 9,949,028 B2
(45) Date of Patent: Apr. 17, 2018

(54) DEVICE FOR MEASURING AN ELECTRIC CURRENT GENERATED BY AN ACOUSTIC AMPLIFIER IN ORDER TO ACTUATE AN ACOUSTIC SPEAKER

(71) Applicant: L-ACOUSTICS, Marcoussis (FR)

(72) Inventors: M. Christian Heil, London (GB); Pierre Vaysse, Antony (FR)

(73) Assignee: L-ACOUSTICS, Marcoussis (FR)

( * ) Notice: Subject to any disclaimer, the term of this patent is extended or adjusted under 35 U.S.C. 154(b) by 0 days.

(21) Appl. No.: 15/433,867

(22) Filed: Feb. 15, 2017

(65) Prior Publication Data
US 2017/0238093 A1    Aug. 17, 2017

(30) Foreign Application Priority Data
Feb. 15, 2016  (FR) ...................................... 16-51213

(51) Int. Cl.
| | |
|---|---|
| H04R 3/00 | (2006.01) |
| H04R 29/00 | (2006.01) |
| H03F 3/183 | (2006.01) |
| G01R 19/00 | (2006.01) |

(52) U.S. Cl.
CPC ......... *H04R 3/007* (2013.01); *G01R 19/0092* (2013.01); *H03F 3/183* (2013.01); *H04R 29/00* (2013.01); *H03F 2200/462* (2013.01)

(58) Field of Classification Search
CPC .................. G01R 19/0092; H03F 3/183; H03F 2200/462; H04R 3/007; H04R 29/00
See application file for complete search history.

(56) References Cited

U.S. PATENT DOCUMENTS

| | | | |
|---|---|---|---|
| 2014/0084999 A1* | 3/2014 | Wan ......................... | H03F 3/45 330/69 |
| 2015/0181335 A1 | 6/2015 | Florian et al. | |
| 2015/0219690 A1 | 8/2015 | Kaya | |

FOREIGN PATENT DOCUMENTS

| | | |
|---|---|---|
| EP | 2632174 A1 | 8/2013 |
| WO | 2009020535 A1 | 2/2009 |

OTHER PUBLICATIONS

Oct. 7, 2016 Preliminary Search Report issued in FR1651213.

* cited by examiner

*Primary Examiner* — Mark Fischer
(74) *Attorney, Agent, or Firm* — Kenealy Vaidya LLP

(57) ABSTRACT

The present invention relates to a device for measuring an electric current generated by an acoustic amplifier in order to actuate an acoustic speaker comprising:
a resistor (1) positioned in series between the amplifier and the speaker;
a voltage-to-current converter (3), the inputs of which are connected to the terminals of the resistor (1), and which proportionally converts the difference in voltage across the terminals of the shunt to a signal current;
a first current mirror (7), the input of which is connected to the output of the voltage-to-current converter (3) and the output of which is connected to
a current-to-voltage converter (5);
a constant bias current generator (9) connected to an input of the voltage-to-current converter (3) and the output of which is connected to the current-to-voltage converter (5) via a second current mirror (11), and capable of generating a bias current such that the device operates in linear mode and without saturation regardless of the electric current generated by the acoustic amplifier.

7 Claims, 2 Drawing Sheets

DEVICE FOR MEASURING AN ELECTRIC CURRENT GENERATED BY AN ACOUSTIC AMPLIFIER IN ORDER TO ACTUATE AN ACOUSTIC SPEAKER

CROSS REFERENCE TO RELATED APPLICATION

This application claims benefit of French Priority Patent Application 16-51213 filed Feb. 15, 2016, the entire contents of which is incorporated herein by reference.

BACKGROUND

Some embodiments relate to a device for measuring an electric current generated by an acoustic amplifier in order to actuate an acoustic speaker.

In the field of electroacoustics and, more particularly, of generating sound by converting an electrical signal to an acoustic wave through the use of speakers, it is important to have precise knowledge of the electric current consumed by these speakers, i.e. the instantaneous current of the electrical signal supplying power to the speakers.

Specifically, as for any energy conversion, this electrical-to-acoustic conversion generates heat and it is therefore necessary to verify that the heat generated remains below a predetermined threshold. This parameter is particularly important in professional speakers intended to fill large spaces with sound, since the amounts of energy used are substantial. The dissipated power is proportional to the square of the RMS amplitude/current of the electrical signal. Thus, knowing how much current is consumed makes it possible to work out the dissipated power and hence how much heat is emitted.

This precise knowledge of the current also has other applications, such as precise knowledge of the impedance of the speakers as a function of the frequency and the detection of the loudspeakers.

In order to measure this electrical signal current, related art techniques use a specialized differential amplifier including a resistor at input (a shunt for measuring the current) allowing a current to be converted to a potential difference.

However, this type of current detection amplifier is intrinsically sensitive to the common mode voltage present on the measurement shunt and therefore necessitates the use of a costly high-precision differential amplifier if the levels of precision required in electroacoustics are to be attained.

SUMMARY

It may be beneficial to provide a device for measuring current that overcomes this drawback, in particular a device that makes it possible to control the effect of measuring on the measured electrical signal, to decrease costs and to improve the sensitivity and precision of the measurement.

In order to address one or more of the aforementioned drawbacks, a device for measuring an electric current generated by an acoustic amplifier in order to actuate an acoustic speaker includes:
- a shunt resistor positioned in series between the acoustic amplifier and the acoustic speaker;
- a voltage-to-current converter, the inputs of which are connected to the terminals of the shunt resistor, said converter being capable of proportionally converting the difference in voltage across the terminals of the shunt to a signal current;
- a first current mirror, the input of which is connected to the output of the voltage-to-current converter and the output of which is connected to
- a current-to-voltage converter such that the output voltage of the current-to-voltage converter is proportional to the signal current.

The device additionally may include a constant bias current generator connected to an input of the voltage-to-current converter and the output of which is connected to the current-to-voltage converter via a second current mirror, said bias current generator being capable of generating a bias current such that the device operates in linear mode and without saturation regardless of the electric current generated by the acoustic amplifier.

Particular features or embodiments, which can be used alone or in combination, are as follows:
  the first and the second current mirrors include:
    a first resistor and
    a first bias voltage generator in series between an input signal connection and ground;
    an operational amplifier, the non-inverting input of which is connected to the input signal upstream of the first resistor and the inverting input of which is connected between the first resistor and the first bias voltage generator by a second resistor, and the output of which is connected to
    the gate of a MOSFET transistor, the source of said MOSFET transistor being connected to the inverting input of the operational amplifier, and the drain of which, generating the mirror current, being connected to an output pad;
  the bias current generator includes:
    a second voltage generator capable of generating a reference voltage (Vref) between the non-inverting input of an operational amplifier and a third, negative bias voltage generator, the second terminal of which is connected to ground; and
    the inverting input of the operational amplifier is connected to the third voltage generator via a resistor as well as to the source
    of an n-type MOSFET transistor, the drain of which delivers the bias current to an output pad;
  the voltage-to-current converter includes:
    an operational amplifier, the inverting input of which is connected to the input of the shunt resistor via a second resistor, the non-inverting input of which is directly connected to the output of the shunt resistor, and the output of which is connected to
    the gate of an n-type MOSFET transistor, the source of which is connected to the inverting input of the operational amplifier and the drain of which delivers the signal current.

BRIEF DESCRIPTION OF THE FIGURES

The invention will be better understood on reading the following description, which is given solely by way of example and with reference to the appended figures in which.

EXEMPLARY EMBODIMENTS

Firstly, it will be recalled that the electric current generated by an acoustic amplifier in order to actuate an acoustic speaker has the characteristics of a variable AC current, in terms of both current/voltage and frequency, which ranges from a few Hz to about 20 kHz.

Figure 1:
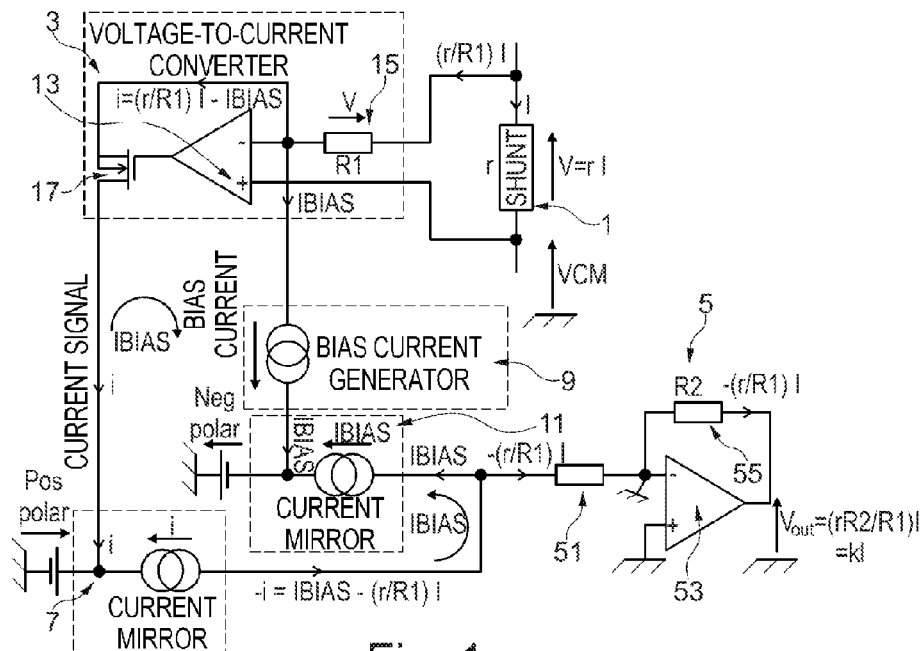
FIG. 1 shows a general circuit diagram of a measurement device according to one embodiment of the invention.

With reference to FIG. 1, a device for measuring an electric current generated by an acoustic amplifier in order to actuate an acoustic speaker comprises a shunt resistor 1 positioned in series between the acoustic amplifier and the acoustic speaker. The ohmic value r of this resistor is very low, of the order of 2 mΩ, so as to interfere only minimally with the electrical signal.

A first voltage-to-current conversion is carried out by a voltage-to-current converter 3, the inputs of which are connected to the terminals of the shunt resistor. The converter is capable of proportionally converting the difference in voltage across the terminals of the shunt resistor 1 to a signal current.

The output of the voltage-to-current converter 3 is connected to a current-to-voltage converter 5 via a first current mirror 7, also referred to as the signal current mirror. Thus, the output voltage of the current-to-voltage converter 5 is proportional to the signal current.

Moreover, in order to allow the circuit to operate continuously in a linear mode and without saturation regardless of the direction of the current and the common mode voltage polarity, the device also comprises a constant bias current generator 9. This bias current is referred to as Ibias hereinafter.

The constant bias current generator 9 is connected to an input of the voltage-to-current converter 3 and the output is connected to the current-to-voltage converter 5 via a second current mirror 11.

The bias current generator 9 is therefore capable of generating a bias current such that the device operates in linear mode and without saturation regardless of the electric current generated by the acoustic amplifier.

The embodiment of each block will now be described in greater detail, followed by an explanation of the operation thereof.

The voltage-to-current converter 3 includes:
an operational amplifier 13, the inverting input of which is connected to the input of the shunt resistor 1 via a second resistor 15 of ohmic value R1, the non-inverting input of which is directly connected to the output of the shunt resistor 1, and the output of which is connected to
the gate of an n-type MOSFET transistor 17, the source of which is also connected to the inverting input of the operational amplifier and the drain of which delivers the signal current.

Figure 2:
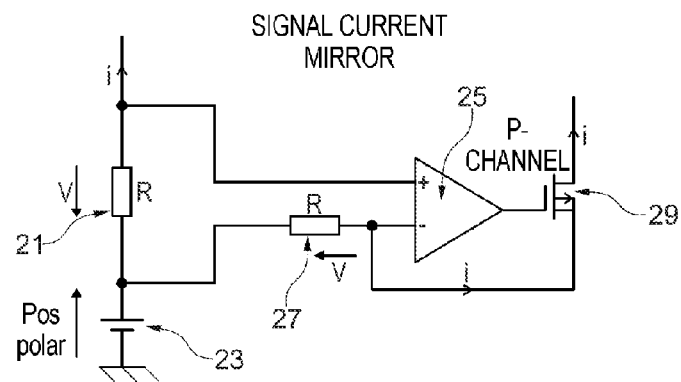
FIG. 2 shows a detailed view of the signal current mirror of the device of FIG. 1.

The first current mirror 7, referred to as the signal current mirror, includes, FIG. 2:
a first resistor 21 and
a first, positive bias voltage generator 23 in series between an input signal connection and ground;
an operational amplifier 25, the non-inverting input of which is connected to the input signal upstream of the first resistor 21 and the inverting input of which is connected between the first resistor 21 and the first bias voltage generator 23 by a second resistor 27, and the output of which is connected to
the gate of a p-type MOSFET transistor 29, the source of said MOSFET transistor being connected to the inverting input of the operational amplifier, and the drain of which, generating the signal mirror current, being connected to an output pad.

Figure 3:
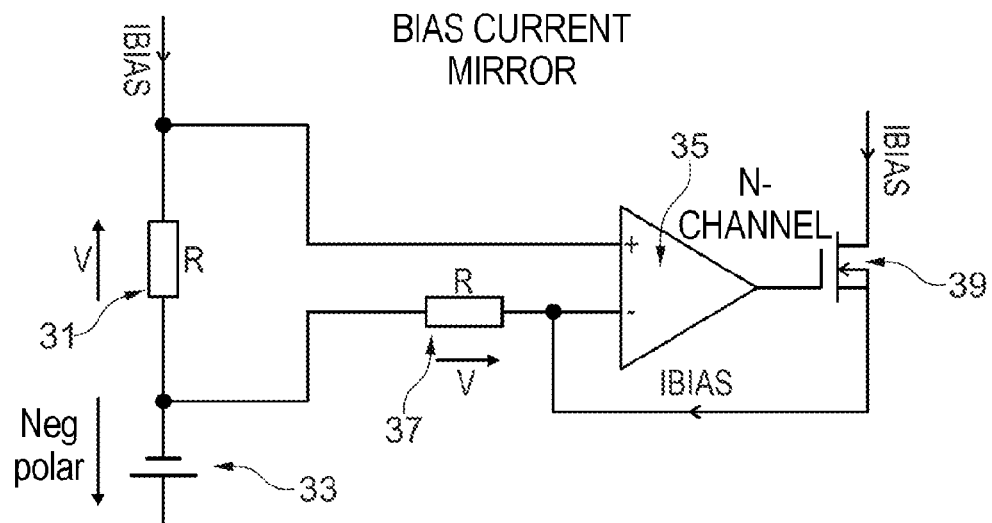
FIG. 3 shows a detailed view of the bias current mirror of the device of FIG. 1.

The structure of the second current mirror 11, FIG. 3, is similar to that of the first current mirror 7. Specifically, it includes:
a first resistor 31 and
a first, negative bias voltage generator 33 in series between an input signal connection and ground;
an operational amplifier 35, the non-inverting input of which is connected to the input signal upstream of the first resistor 31 and the inverting input of which is connected between the first resistor 31 and the first bias voltage generator 33 by a second resistor 37, and the output of which is connected to
the gate of an n-type MOSFET transistor 39, the source of said MOSFET transistor being connected to the inverting input of the operational amplifier, and the drain of which, generating the bias mirror current, being connected to an output pad.

Thus, the two differences between the two current mirrors pertain to the type of MOSFET transistor and to the sign of the bias of the voltage generators.

Figure 4:
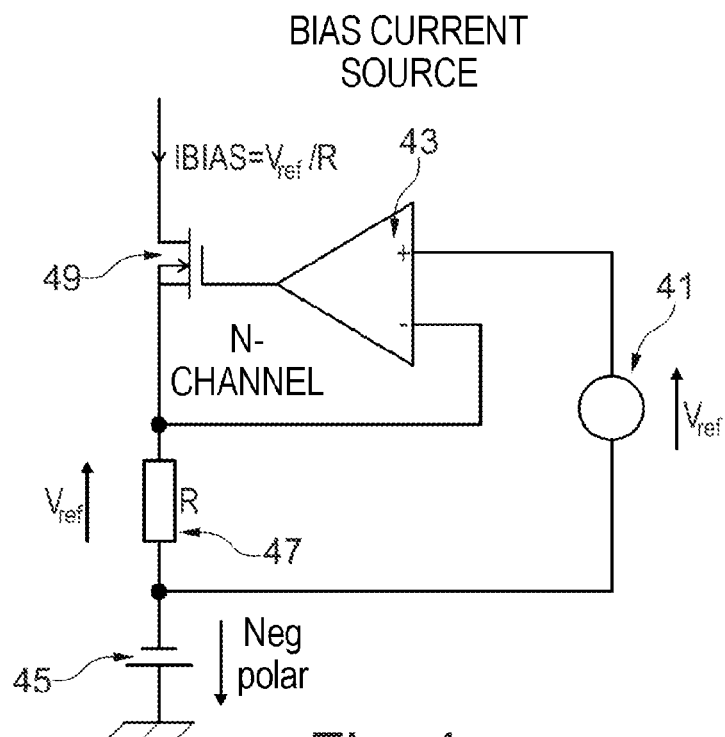
FIG. 4 shows a detailed view of the bias current source of the device of FIG. 1.

Lastly, the bias current generator 9 includes, FIG. 4:
a second voltage generator 41 capable of generating a reference voltage (Vref) between the non-inverting input of an operational amplifier 43 and a third, negative bias voltage generator 45, the second terminal of which is connected to ground; and
the inverting input of the operational amplifier is connected to the third voltage generator 45 via a resistor 47 as well as to the source
of an n-type MOSFET transistor 49, the drain of which delivers the bias current to an output pad.

The current-to-voltage converter 5 comprises, FIG. 1, a resistor 51 at input which is connected in series with the inverting input of an operational amplifier 53, the non-inverting input of which is connected to ground. The output of the operational amplifier 53 loops back to the inverting input thereof via a resistor 55.

Thus, in operation, the signal current and the constant bias current are added together and follow the "signal pathway" consisting in the first current mirror 7.

The bias current is also conducted by the "bias pathway" including the bias current generator 9 and the second current mirror 11.

Additionally, at the input of the current-to-voltage converter 5, the currents of the "signal pathway" and of the "bias pathway" are added together, but since the bias current flows in the opposite direction on these two pathways, it is cancelled out at the input of the current-to-voltage converter.

It should be noted that a measurement circuit using only conventional components has been described.

Typically, the operational amplifiers are low-noise operational amplifiers and operate at relatively low levels of gain.

It should also be noted that operation in which the bias current is cancelled out at the input of the current-to-voltage converter also affords the advantage of removing the parasitic currents from the MOSFET transistors.

Furthermore, the use of controlled current sources by nature limits the effects of the common mode voltage in comparison with differential assemblies based on voltage detection.

It should thus be noted that a low-cost measurement device that is particularly well suited to the field of electroacoustics has been described.

The assembly is also capable of measuring a zero frequency current (DC current). It allows, by virtue of its high level of immunity to the common mode voltage, speaker detection with a good signal-to-noise ratio even in the presence of a weak excitation signal. As the passband of the assembly is mainly limited by the performance of the operational amplifiers, it permits a high frequency of use. This characteristic provides, in the audio frequency domain, a low level of attenuation and a small phase shift of the signal in the high frequency range. The assembly allows fast current protection to be achieved. Due to its high level of reliability, it may be used to control speakers with current (producing a transconductance amplifier).

The invention has been illustrated and described in detail in the drawings and the description above. This should be considered as illustrative and provided by way of example, and not as limiting the invention to this single description. Numerous variant embodiments are possible.

In the claims, the word "comprising" or "including" does not exclude other elements and the indefinite article "a/an" does not exclude a plurality.

The invention claimed is:

1. A device for measuring an electric current generated by an acoustic amplifier in order to actuate an acoustic speaker, comprising:
    a shunt resistor having terminals and positioned in series between the acoustic amplifier and the acoustic speaker;
    a voltage-to-current converter having inputs and an output, the inputs being connected to the terminals of the shunt resistor, said converter being capable of proportionally converting the difference in voltage across the terminals of the shunt resistor to a signal current;
    a first current mirror having an input and an output, the input being connected to the output of the voltage-to-current converter;
    a current-to-voltage converter connected to the output of first current mirror, such that the output voltage of the current-to-voltage converter is proportional to the signal current; and
    a constant bias current generator connected to one of the inputs of the voltage-to-current converter and the output of which is connected to the current-to-voltage converter via a second current mirror, said bias current generator being capable of generating a bias current such that the device operates in linear mode and without saturation regardless of the electric current generated by the acoustic amplifier.

2. The device as claimed in claim 1, wherein the first and the second current mirrors comprise:
    a first resistor, and
    a first bias voltage generator in series between an input signal connection and ground;
    an operational amplifier, the non-inverting input of which is connected to the input signal upstream of the first resistor and the inverting input of which is connected between the first resistor and the first bias voltage generator by a second resistor, and the output of which is connected to
    the gate of a MOSFET transistor, the source of said MOSFET transistor being connected to the inverting input of the operational amplifier, and the drain of which, generating the mirror current, being connected to an output pad.

3. The device as claimed in claim 2, wherein the bias current generator comprises:
    a second voltage generator capable of generating a reference voltage (Vref) between the non-inverting input of an operational amplifier, and a third, negative bias voltage generator, the second terminal of which is connected to ground; and
    the inverting input of the operational amplifier is connected to the third voltage generator via a resistor as well as to the source
    of an n-type MOSFET transistor, the drain of which delivers the bias current to an output pad.

4. The device as claimed in claim 2, wherein the voltage-to-current converter comprises:
    an operational amplifier, the inverting input of which is connected to the input of the shunt resistor via a second resistor, the non-inverting input of which is directly connected to the output of the shunt resistor, and the output of which is connected to
    the gate of an n-type MOSFET transistor, the source of which is connected to the inverting input of the operational amplifier and the drain of which delivers the signal current.

5. The device as claimed in claim 1, wherein the bias current generator comprises:
    a second voltage generator capable of generating a reference voltage between the non-inverting input of an operational amplifier, and a third, negative bias voltage generator, the second terminal of which is connected to ground; and
    the inverting input of the operational amplifier is connected to the third voltage generator via a resistor as well as to the source
    of an n-type MOSFET transistor, the drain of which delivers the bias current to an output pad.

6. The device as claimed in claim 5, wherein the voltage-to-current converter comprises:
    an operational amplifier, the inverting input of which is connected to the input of the shunt resistor via a second resistor, the non-inverting input of which is directly connected to the output of the shunt resistor, and the output of which is connected to
    the gate of an n-type MOSFET transistor, the source of which is connected to the inverting input of the operational amplifier and the drain of which delivers the signal current.

7. The device as claimed in claim 1, wherein the voltage-to-current converter comprises:
    an operational amplifier, the inverting input of which is connected to the input of the shunt resistor via a second resistor, the non-inverting input of which is directly connected to the output of the shunt resistor, and the output of which is connected to
    the gate of an n-type MOSFET transistor, the source of which is connected to the inverting input of the operational amplifier and the drain of which delivers the signal current.

* * * * *